(12) United States Patent
Boas et al.

(10) Patent No.: US 7,233,539 B2
(45) Date of Patent: Jun. 19, 2007

(54) NON-VOLATILE FUSE CIRCUIT

(75) Inventors: Andre Luis Vilas Boas, Campinas (BR); Alfredo Olmos, Campinas (BR)

(73) Assignee: Freescale Semiconductor, Inc., Austin, TX (US)

( * ) Notice: Subject to any disclaimer, the term of this patent is extended or adjusted under 35 U.S.C. 154(b) by 172 days.

(21) Appl. No.: 11/135,963

(22) Filed: May 24, 2005

(65) Prior Publication Data

US 2006/0268644 A1 Nov. 30, 2006

(51) Int. Cl.
*G11C 17/18* (2006.01)
(52) U.S. Cl. .................... 365/225.7; 365/194
(58) Field of Classification Search ............ 365/96, 365/194, 225.7
See application file for complete search history.

(56) References Cited

U.S. PATENT DOCUMENTS

| | | | | |
|---|---|---|---|---|
| 5,723,999 A * | 3/1998 | Merritt | ................ | 327/526 |
| 6,031,775 A * | 2/2000 | Chang et al. | ................ | 365/205 |
| 6,087,889 A | 7/2000 | Mok | | |
| 6,157,583 A * | 12/2000 | Starnes et al. | ............... | 365/200 |
| 6,175,261 B1 | 1/2001 | Sundararaman et al. | | |
| 6,346,845 B1 * | 2/2002 | Choi | ........................... | 327/525 |
| 6,384,664 B1 | 5/2002 | Hellums et al. | | |
| 6,654,304 B1 | 11/2003 | Huang | | |
| 6,906,557 B1 * | 6/2005 | Parker et al. | .................. | 327/53 |

* cited by examiner

*Primary Examiner*—Anh Phung
*Assistant Examiner*—Hien N Nguyen

(57) ABSTRACT

A non-volatile memory cell 100 includes a static latch 125 having a first terminal and a second terminal, a first transistor 124 having a first current electrode coupled to said first terminal of said static latch 125 and a fusible element 110 having a first terminal coupled to a second current electrode of the first transistor 125 and a second terminal coupled to a first power supply voltage terminal. In a particular embodiment, the non-volatile memory cell includes a fusible element programming circuit 140 coupled to the first terminal of said fusible element. In another particular embodiment, the non-volatile memory cell includes a cell preset circuit 120 coupled to a control electrode of the first transistor.

19 Claims, 2 Drawing Sheets

NON-VOLATILE FUSE CIRCUIT

FIELD OF THE DISCLOSURE

The invention relates generally to memory cells, and more particularly to non-volatile memory cells.

BACKGROUND

In many integrated circuit fabrication processes, it can be difficult to maintain uniform conditions. As a result, integrated circuits from a fabrication process can have different electrical characteristics. Some integrated circuits may even differ from a desired target of an electrical specification. Accordingly, it can be beneficial if the integrated circuit contains a trimming circuit to adjust the electrical characteristics of the integrated circuit.

In some integrated circuits, including ROM-based devices, it can be difficult to store trimming related information because writing the trimming information into memory would use valuable memory slots. Other techniques of storing trimming related information have their own limitations. For example, floating gate cells are reliable but are expensive to make. Laser fuses can be used, but these fuses can be difficult to manufacture and test. Electrical fuses may also be used, but the state of an electrical fuse can be difficult to determine if the fuse is only partially blown. Accordingly, there is a need for a memory cell able to reliably store trimming related information, and that can be manufactured relatively inexpensively.

BRIEF DESCRIPTION OF THE DRAWINGS

The present disclosure may be better understood, and its numerous features and advantages made apparent to those skilled in the art by referencing the accompanying drawing, in which like reference numbers indicate similar or identical items.

DETAILED DESCRIPTION OF THE DRAWINGS

Figure 1:
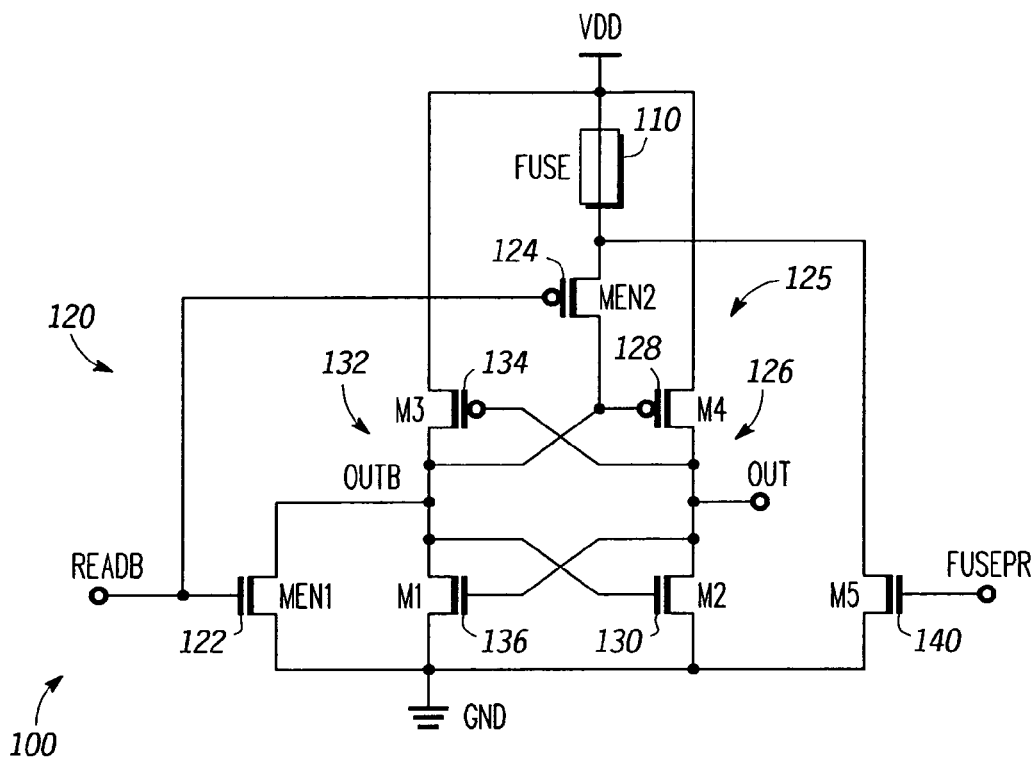
FIG. 1 illustrates in schematic form a circuit diagram of a particular embodiment of a non-volatile memory cell according to the present invention.

A non-volatile memory cell and method for reading it are disclosed. In one embodiment, the non-volatile memory cell includes a fuse with a first terminal coupled to a first power supply voltage terminal, and a second terminal, a first transistor having a first current electrode coupled to the second terminal of the fuse, a control electrode for receiving a control signal, and a second current electrode. The cell also includes a first inverter having an input terminal coupled to the second current electrode of the first transistor, and an output terminal for providing an output of the non-volatile memory cell. The cell further includes a second inverter having an input terminal coupled to the output terminal of the first inverter, and an output terminal coupled to the input terminal of the first inverter.

In one aspect, the non-volatile memory cell includes a second transistor having a first current electrode coupled to the input terminal of the first inverter, a control electrode for receiving the control signal, and a second current electrode coupled to a second power supply voltage terminal. In another aspect, the non-volatile memory cell includes a second transistor having a first current electrode coupled to the second terminal of the fuse, a control electrode for receiving a program signal, and a second current electrode coupled to a second power supply voltage terminal.

In another aspect of the non-volatile memory cell, the first inverter includes a second transistor having a first current electrode coupled to the first power supply voltage terminal, a second current electrode coupled to the output terminal of the first inverter and a control electrode coupled to the input terminal of the first inverter. The first inverter also includes a third transistor having a first current electrode coupled to the output terminal of the first inverter, a second current electrode coupled to a second power supply voltage terminal and a control electrode coupled to the input terminal of the first inverter. In one aspect, the second transistor is a p-channel transistor and the third transistor is an n-channel transistor.

In one aspect of the non-volatile memory cell, the second inverter includes a fourth transistor having a first current electrode coupled to the first power supply voltage terminal, a second current electrode coupled to the input terminal of the first inverter and a control electrode coupled to the output terminal of said first inverter. The second inverter also includes fifth transistor having a first current electrode coupled to the input node of the first inverter, a second current electrode coupled to the second power supply voltage and a control electrode coupled to the output terminal of the first inverter. In one aspect the sixth transistor is a p-channel transistor and the seventh transistor is an n-channel transistor.

In another embodiment, a non-volatile memory cell includes a static latch having a first terminal and a second terminal, a first transistor having a first current electrode coupled to the first terminal of the static latch and a fusible element having a first terminal coupled to a second current electrode of the first transistor and a second terminal coupled to a first power supply voltage terminal.

In one aspect, the non-volatile memory cell also includes a fusible element programming circuit coupled to the first terminal of the fusible element. In a particular aspect the fusible element programming circuit includes a second transistor having a first current electrode coupled to the first terminal of the fusible element and a second current electrode coupled to a second power supply voltage terminal.

In another aspect, the non-volatile memory cell includes a cell preset circuit coupled to a control electrode of the first transistor. In a particular aspect, the cell preset circuit includes a second transistor with a first current electrode coupled to the first terminal of the static latch and a second current electrode coupled to a second power supply voltage terminal.

In an aspect of the non-volatile memory cell, the static latch includes a first inverter with an input coupled to the first terminal of the static latch and an output coupled to the second terminal of the static latch. The static latch also includes a second inverter with an input coupled to the input of the first inverter and an output coupled to the input of the first inverter.

In another aspect of the non-volatile memory cell, the first inverter includes a second transistor with first current electrode coupled to the first power supply voltage terminal and a second current electrode coupled to an output of the first inverter and a control electrode coupled to an input of the first inverter. The first inverter also includes a third transistor with a first current electrode coupled to the output of the first inverter and a second current electrode coupled to a second power supply voltage terminal and a control electrode coupled to the input of said first inverter.

In another aspect of the non-volatile memory cell, the second inverter includes a fourth transistor with a first current electrode coupled to the first power supply voltage terminal and a second current electrode coupled to the input of the first inverter and a control electrode coupled to the output of the first inverter. The second inverter also includes a fifth transistor with a first current electrode coupled to the input of the first inverter and a second current electrode coupled to the second power supply voltage terminal and a control electrode coupled to the output of said first inverter.

In another aspect of the disclosure, the non-volatile memory cell includes a trimming circuit coupled to the second terminal of the static latch to adjust the characteristics of an integrated circuit.

In one embodiment, a method for reading a non-volatile memory cell includes presetting a static latch circuit to a first state, selectively setting the latch circuit to a second state in response to a condition of a fuse, and providing an output of the non-volatile memory cell representative of a state of said latch circuit after selectively setting the latch circuit. In one aspect, the method includes driving the fuse. In another aspect, driving the fuse includes applying a current to the fuse. In still another aspect, the method includes trimming an integrated circuit based on the output of the static latch.

Referring to FIG. 1, a circuit diagram of a particular embodiment of a non-volatile memory cell according to the present invention is illustrated. The non-volatile memory cell 100 includes a fuse 110. In a particular embodiment, the fuse 110 is a polysilicon fuse. The fuse 110 has a first terminal connected to a first power supply voltage terminal, labeled "VDD", and a second terminal connected to a first current electrode of a transistor 124. The transistor 124 has a second current electrode connected to a static latch 125. The transistor 124 also has a control electrode to receive a control signal, labeled "READB."

The static latch 125 includes an inverter 126 and an inverter 132. The inverter 126 has an input terminal connected to the second current electrode of the transistor 124, and an output terminal for providing a true output of the non-volatile memory cell 100 for providing a signal labeled "OUT." The inverter 132 includes an input terminal connected to the output terminal of the inverter 126, and a complementary output terminal connected to the input terminal of the inverter 126 for providing a signal labeled "OUTB."

The non-volatile memory cell 100 also includes a transistor 140. The transistor 140 has a first current electrode connected to the second terminal of the fuse 110, a control electrode for receiving a program signal, labeled "FUSEPR", and a second current electrode connected to the power supply voltage terminal, labeled "GND."

The static latch 125 is connected to a cell preset circuit 120, comprised of a transistor 122. The transistor 122 includes a first current electrode connected to the input terminal of the inverter 126, a control electrode for receiving the control signal READB, and a second current electrode connected to the power supply voltage terminal labeled "GND."

The inverter 126 includes a transistor 128 and a transistor 130. The transistor 128 has a first current electrode connected to the first power supply voltage terminal, a second current electrode connected to the output terminal of the inverter 126 and a control electrode connected to the input terminal of the inverter 126. The transistor 130 includes a first current electrode connected to the output terminal of the inverter 126, a second current electrode connected to the second power supply voltage terminal and a control electrode connected to the input terminal of the inverter 126. In the illustrated embodiment, the transistor 128 is a p-channel metal-oxide semiconductor (MOS) transistor and the transistor 130 is an n-channel MOS transistor.

The inverter 132 includes a transistor 134 and a transistor 136. The transistor 134 includes a first current electrode connected to the first power supply voltage terminal, a second current electrode connected to the input terminal of the inverter 126 and a control electrode connected to the output terminal of the inverter 126. The transistor 136 includes a first current electrode connected to the input node of the inverter 126, a second current electrode connected to the second power supply voltage terminal and a control electrode connected to the output terminal of the inverter 126. In the illustrated embodiment, the transistor 134 is a p-channel MOS transistor and the transistor 136 is an n-channel MOS transistor.

Fuse 110 is programmed or "blown" by assertion of the FUSEPR signal at the control electrode of the transistor 140. The transistor 140 thus performs as a fusible element programming circuit. When the FUSEPR signal is asserted, the voltage at the first power supply voltage terminal is applied to the fuse 110, driving a relatively high current through the fuse. This current alters the impedance value of the fuse 110 by heating the polysilicon material of the fuse, causing it to melt. After the current has been driven through the fuse 110, the fuse material cools. It is possible that the fuse 110 will not be completely blown in that there may still be some conductive material in the fuse 110 after the fuse has been driven.

The state of the non-volatile memory cell 100 may be read as follows. The static latch 125 is first preset by a cell preset circuit formed by the transistor 122. Negation of the READB signal at a logic high will precharge the static latch 125 to a first state. Negation of the READB signal will cause the transistor 122 to become conductive and cause the transistor 124 to be nonconductive, thereby electrically decoupling the fuse 110 from the input of the inverter 126 and pulling the input to the inverter 126 to GND through the transistor 122. The inverter 126 will invert the input thereof to a logic high. The inverter 132, in a feedback relationship with the inverter 126, will reinforce the READB signal at the input of the inverter 126. Assertion of the READB signal will couple the fuse 110 to the latch 125. The state of the fuse 110 determines the state of the latch 125 when the READB signal is asserted.

In the illustrated particular embodiment, when the READB signal is asserted, the state of the fuse 110 determines the output of the inverter 126. The inverter 132 is in a feedback arrangement with the inverter 126 to latch the output.

The non-volatile memory cell illustrated in FIG. 1 is sensitive to changes in the impedance of the fuse 110. This can provide an advantage in that the circuit may still function if the fuse 110 is only partially blown. In addition, the circuit illustrated in FIG. 1 does not require the use of floating gate transistors, allowing the circuit to be formed through a simpler manufacturing process.

The fuse 110 is a polysilicon fuse with a total resistance of approximately 30 ohms. The fuse 110 is formed in an hourglass shape, with a tapered center and flared extremes to help ensure that the fuse will melt during programming. The fuse 110 takes approximately 5 milliseconds to melt at a current of 15 mA. Programming of the fuse 110 can be achieved with a voltage supply down to about 3 volts.

Figure 2:
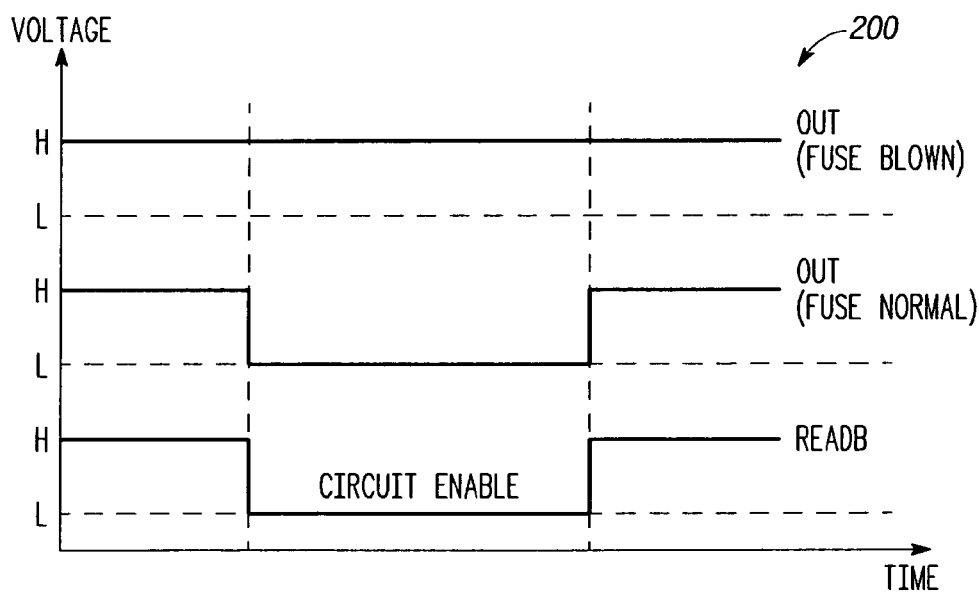
FIG. 2 illustrates a simplified timing diagram for the non-volatile memory cell of FIG. 1.

Referring to FIG. 2, a timing diagram 200 for the non-volatile memory cell 100 depicted in FIG. 1 is illustrated. The timing diagram 200 illustrates a particular embodiment for reading the state of the non-volatile memory cell.

As illustrated by the signal READB, a static latch circuit is preset to a first state in which signal OUT is at a logic high state. The latch circuit is selectively set to a second state in response to a condition of the fuse. In the FUSE BLOWN state, the signal OUT remains at a logic high state when the READB signal is placed at a logic low state. In the FUSE NORMAL state, the signal OUT is placed in a logic low state when the READB signal is place at a logic low state. In this way, the output of the static latch is representative of the state of the fuse.

Figure 3:
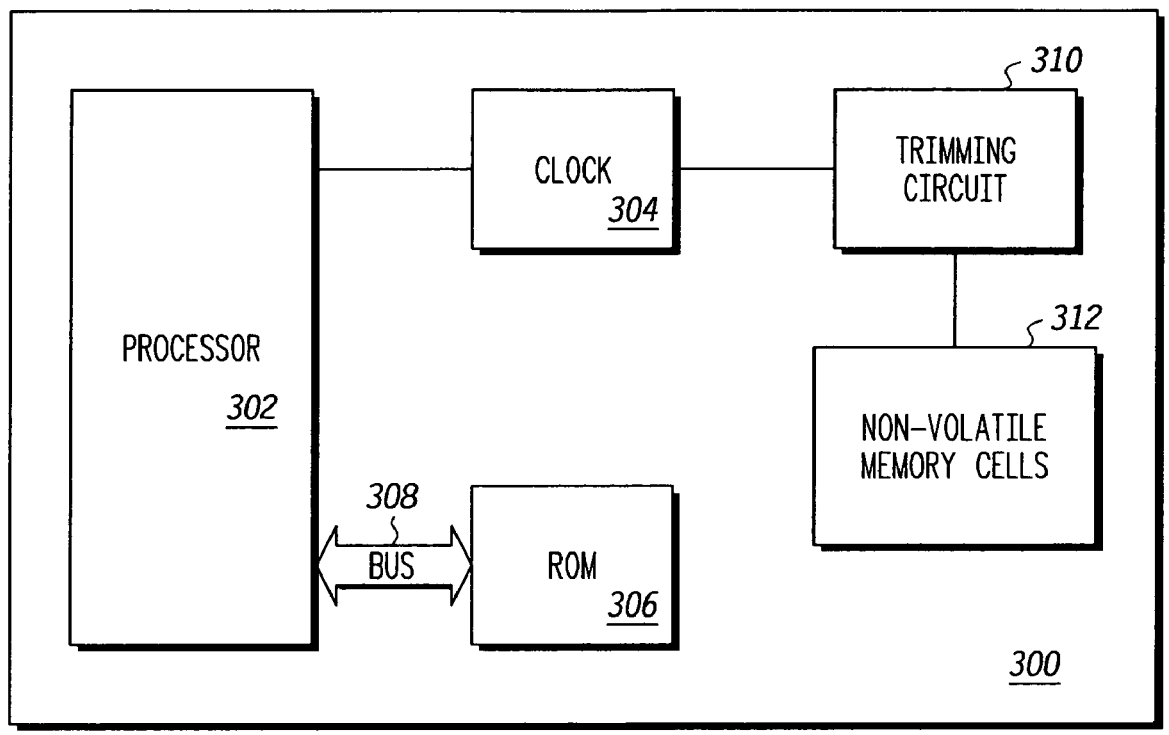
FIG. 3 illustrates in block diagram form a microcontroller (MCU) including non-volatile memory cells like the non-volatile memory cell of FIG. 1.

Referring to FIG. 3, a block diagram of a microcontroller (MCU) incorporating a non-volatile memory cell like the memory cell 100 of FIG. 1 is illustrated. As depicted, an integrated circuit 300 includes a processor 302 connected to a clock 304. The processor 302 is also connected to a read-only memory (ROM) 306 via a bus 308. The clock 304 is connected to a trimming circuit 310. The trimming circuit 310 is connected to non-volatile memory cells 312.

The ROM 306 stores information accessible to the processor 302. The processor accesses the information in the ROM 306 via the bus 308.

The clock 304 supplies a clock signal to the processor 302. The processor 302 uses this clock signal to perform and synchronize its operations. The frequency of the clock 304 is adjusted with the trimming circuit 310. Adjustment of the trimming circuit 310 results in adjustment of the clock signal frequency provided by the clock 304 to the processor 302 and is based on the state of the non-volatile memory cells 312.

The trimming circuit 310 activates a signal, such as the READB signal illustrated in FIG. 2, to read the values of the non-volatile memory cells 312. The trimming circuit stores the values of the non-volatile memory cells, and uses these values to adjust the frequency of the clock 304.

Aspects of the above disclosure may be varied without departing from the scope of the disclosure. For example, different static latches may be used, including static latches that do not use a pair of cross-coupled inverters. In addition, different types of fuses or anti-fuse may be used. Furthermore, the fuse may be programmed or "blown" in a variety of ways, such as by application of a laser.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A non-volatile memory cell comprising:
   a fuse having a first terminal coupled to a first power supply voltage terminal, and a second terminal;
   a first transistor having a first current electrode coupled to said second terminal of said fuse, a control electrode for receiving a control signal, and a second current electrode;
   a first inverter having an input terminal coupled to said second current electrode of said first transistor, and an output terminal for providing an output of the non-volatile memory cell; and
   a second inverter having an input terminal coupled to said output terminal of said first inverter, and an output terminal coupled to said input terminal of said first inverter.

2. The non-volatile memory cell of claim 1, further comprising:
   a second transistor having a first current electrode coupled to said input terminal of said first inverter, a control electrode for receiving said control signal, and a second current electrode coupled to a second power supply voltage terminal.

3. The non-volatile memory cell of claim 1, further comprising:
   a second transistor having a first current electrode coupled to said second terminal of said fuse, a control electrode for receiving a program signal, and a second current electrode coupled to a second power supply voltage terminal.

4. The non-volatile memory cell of claim 1, wherein said first inverter comprises:
   a second transistor having a first current electrode coupled to said first power supply voltage terminal, a second current electrode coupled to said output terminal of said first inverter and a control electrode coupled to said input terminal of said first inverter; and
   a third transistor having a first current electrode coupled to said output terminal of said first inverter, a second current electrode coupled to a second power supply voltage terminal and a control electrode coupled to said input terminal of said first inverter.

5. The non-volatile memory cell of claim 4, wherein said second transistor is a p-channel transistor and said third transistor is an n-channel transistor.

6. The non-volatile memory cell of claim 4, wherein said second inverter comprises:
   a fourth transistor having a first current electrode coupled to said first power supply voltage terminal, a second current electrode coupled to said input terminal of said first inverter and a control electrode coupled to said output terminal of said first inverter; and
   a fifth transistor having a first current electrode coupled to said input node of said first inverter, a second current electrode coupled to said second power supply voltage and a control electrode coupled to said output terminal of said first inverter.

7. The non-volatile memory cell of claim 6, wherein said fourth transistor is a p-channel transistor and said fifth transistor is an n-channel transistor.

8. A non-volatile memory cell comprising:
   a static latch having a first terminal and a second terminal;
   a first transistor having a first current electrode coupled to said first terminal of said static latch; and
   a fusible element having a first terminal coupled to a second current electrode of said first transistor and a second terminal coupled to a first power supply voltage terminal.

9. The non-volatile memory cell of claim 8, further comprising:

a fusible element programming circuit coupled to said first terminal of said fusible element.

10. The non-volatile memory cell of claim 9, wherein said fusible element programming circuit comprises a second transistor having a first current electrode coupled to said first terminal of said fusible element and a second current electrode coupled to a second power supply voltage terminal.

11. The non-volatile memory cell of claim 8, further comprising:
   a cell preset circuit coupled to a control electrode of said first transistor.

12. The non-volatile memory cell of claim 11, wherein said cell preset circuit comprises a second transistor having a first current electrode coupled to said first terminal of said static latch and a second current electrode coupled to a second power supply voltage terminal.

13. The non-volatile memory cell of claim 8, wherein said static latch comprises:
   a first inverter having an input coupled to said first terminal of said static latch and an output coupled to said second terminal of said static latch; and
   a second inverter having an input coupled to said output of said first inverter and an output coupled to said input of said first inverter.

14. The non-volatile memory cell of claim 13, wherein said first inverter comprises a second transistor having a first current electrode coupled to said first power supply voltage terminal and a second current electrode coupled to an output of said first inverter and a control electrode coupled to an input of said first inverter and a third transistor having a first current electrode coupled to said output of said first inverter and a second current electrode coupled to a second power supply voltage terminal and a control electrode coupled to said input of said first inverter.

15. The non-volatile memory cell of claim 13, wherein said second inverter comprises a fourth transistor having a first current electrode coupled to said first power supply voltage terminal and a second current electrode coupled to said input of said first inverter and a control electrode coupled to said output of said first inverter and a fifth transistor having a first current electrode coupled to said input of said first inverter and a second current electrode coupled to said second power supply voltage terminal and a control electrode coupled to said output of said first inverter.

16. The non-volatile memory cell of claim 13, further comprising:
   a trimming circuit coupled to said second terminal of said static latch to adjust the characteristics of an integrated circuit.

17. A method for reading a non-volatile memory cell comprising the steps of:
   presetting a static latch circuit to a first state;
   selectively setting said latch circuit to a second state in response to a condition of a fuse;
   providing an output of the non-volatile memory cell representative of a state of said latch circuit after said step of selectively setting; and
   trimming an integrated circuit based on the output of said latch.

18. The method of claim 17, further comprising:
   programming said fuse.

19. The method of claim 18, wherein programming said fuse comprises applying a current to said fuse.

* * * * *

UNITED STATES PATENT AND TRADEMARK OFFICE
CERTIFICATE OF CORRECTION

| | |
|---|---|
| PATENT NO. | : 7,233,539 B2 |
| APPLICATION NO. | : 11/135963 |
| DATED | : June 19, 2007 |
| INVENTOR(S) | : Andre Luis Vilas Boas et al. |

It is certified that error appears in the above-identified patent and that said Letters Patent is hereby corrected as shown below:

Column No. 8, Line No. 26, Claim 17 change "said latch" to --said static latch--

Signed and Sealed this

Sixth Day of November, 2007

JON W. DUDAS
*Director of the United States Patent and Trademark Office*